United States Patent
Syllaios et al.

(10) Patent No.: US 7,015,074 B2
(45) Date of Patent: Mar. 21, 2006

(54) VACUUM PACKAGE FABRICATION OF INTEGRATED CIRCUIT COMPONENTS

(75) Inventors: Athanasios J. Syllaios, Richardson, TX (US); Roland W. Gooch, Dallas, TX (US); Thomas R. Schimert, Ovilla, TX (US)

(73) Assignee: L-3 Communications Corporation, New York, NY (US)

( * ) Notice: Subject to any disclaimer, the term of this patent is extended or adjusted under 35 U.S.C. 154(b) by 0 days.

(21) Appl. No.: 10/967,764

(22) Filed: Oct. 18, 2004

(65) Prior Publication Data

US 2005/0042839 A1 Feb. 24, 2005

Related U.S. Application Data

(63) Continuation of application No. 10/428,627, filed on May 2, 2003, now Pat. No. 6,879,035.

(51) Int. Cl.
*H01L 21/44* (2006.01)
*H01L 21/48* (2006.01)
*H01L 21/50* (2006.01)

(52) U.S. Cl. .................. 438/125; 438/109; 438/456

(58) Field of Classification Search ............... 438/106, 438/107, 109, 125, 455, 456; 257/704, 684, 257/678
See application file for complete search history.

(56) References Cited

U.S. PATENT DOCUMENTS

| 5,388,443 | A | 2/1995 | Manaka .................... 73/31.06 |
| 5,415,726 | A | 5/1995 | Staller et al. .................... 216/2 |
| 5,701,008 | A | 12/1997 | Ray et al. .................... 250/352 |
| 5,915,168 | A | 6/1999 | Salatino et al. ............. 438/110 |
| 6,018,380 | A | 1/2000 | Hu et al. .................... 349/153 |
| 6,036,872 | A | 3/2000 | Wood et al. .................... 216/2 |
| 6,062,461 | A | 5/2000 | Sparks et al. ............. 228/123.1 |
| 6,303,976 | B1 | 10/2001 | Gaintan et al. ............. 257/619 |
| 6,479,320 | B1 | 11/2002 | Gooch .................... 438/109 |
| 6,521,477 | B1 | 2/2003 | Gooch et al. ............... 438/106 |
| 6,537,892 | B1 | 3/2003 | Jordan et al. ............... 438/406 |
| 6,586,831 | B1 | 7/2003 | Gooch et al. ............. 257/704 |
| 2002/0000646 | A1 | 1/2002 | Gooch et al. ............... 257/666 |
| 2002/0106862 | A1 | 8/2002 | Jordan et al. ............... 438/406 |

FOREIGN PATENT DOCUMENTS

EP 0 794 558 A1 9/1997

OTHER PUBLICATIONS

PCT Notification of Transmittal of the International Search Report and the Written Opinion of the International Searching Authority, or the Declaration mailed Sep. 15, 2004, regarding PCT/US 2004/012131 filed Apr. 19, 2004 (12 pages).

Primary Examiner—Michael Trinh
Assistant Examiner—Khanh Duong
(74) Attorney, Agent, or Firm—O'Keefe, Egan & Peterman, LLP

(57) ABSTRACT

A method for manufacturing integrated circuit device lids includes creating a lid cavity on the surface of a lid wafer, forming a sealing surface on the lid wafer that surrounds the lid cavity, and forming a trench on the lid wafer between the lid cavity and the sealing surface. The resulting structure uptakes excess sealing surface material and prevents such material from entering the lid cavity.

14 Claims, 3 Drawing Sheets

VACUUM PACKAGE FABRICATION OF INTEGRATED CIRCUIT COMPONENTS

CROSS-REFERENCE TO RELATED APPLICATION

This application is a continuation of U.S. application Ser. No. 10/428,627 filed May 2, 2003, now U.S. Pat No. 6,879,035, entitled Vacuum Package Fabrication of Integrated Circuit Components.

TECHNICAL FIELD OF THE INVENTION

This invention relates generally to integrated circuit fabrication and, more particularly, to a system and method for vacuum package integrated circuit component lids, or similar devices, used during fabrication of vacuum-packaged circuit components.

BACKGROUND OF THE INVENTION

Microelectromechanical systems (MEMS) are integrated micro devices or systems combining electrical and mechanical components. MEMS devices may be fabricated using standard integrated circuit batch processing techniques and may have a variety of applications including sensing, controlling, and actuating on the micro scale. MEMS devices may function individually or in arrays to generate effects on a macro scale.

Many MEMS devices benefit from a vacuum environment in order to obtain maximum performance. The vacuum package also provides protection and an optimal operating environment for the MEMS device. Examples of these MEMS devices are infrared MEMS such as bolometers and certain inertial MEMS such as gyros and accelerometers. Currently MEMS devices are individually packaged in vacuum-compatible packages after fabricating and dicing of the MEMS device. Under current packaging methods, the packaging costs of MEMS devices can be as much as ten to one hundred times the fabrication costs. These high packaging costs make it difficult to develop commercially-viable, vacuum-packaged MEMS devices.

SUMMARY OF THE INVENTION

Lid wafers and device wafers are often mated and sealed using solder, adhesive, or compression methods that result in excess sealing material being deposited within the area occupied by a MEMS device, integrated circuit, infrared detector, or other devices contained within mated lid wafers and device wafers. This excess material may exist because of the desirability of a complete and airtight seal between the device wafer and lid wafer. Accordingly, more sealing material than is required for an effective seal may be deposited between the lid wafer and device wafer. When the device wafer and lid wafers are mated, the excess sealing material may invade the resulting cavity and interfere with the operation of the MEMS device, integrated circuit, infrared detector, or other device enclosed therein.

Among other things, various embodiments of the present invention address the problem of excess solder, adhesive, or other sealing material used in sealing a lid wafer to a device wafer that contains a MEMS device, integrated circuit, or infrared detector. According to an embodiment of the present invention, an improved method for vacuum packaging such devices during fabrication is provided which substantially reduces disadvantages and problems associated with previously disclosed methods of vacuum packaging MEMS or similar devices. According to one embodiment of the present invention, there is provided a method for manufacturing lids and lid wafers for MEMS devices that comprises forming a trench between a sealing surface and a lid cavity whereby the trench is able to uptake the excess solder and prevent the solder from interfering with the operation of the MEMS or similar device.

The present invention provides various advantages over traditional lid manufacturing methods. It should be noted that any given embodiment may provide some, all, or none of these advantages. For example, because the trenches are created in the lid wafer prior to the separation of the individual vacuum-packaged MEMS devices, significant time and resources are conserved. Additionally, by providing a trench operable to uptake excess solder, the number of MEMS devices that are destroyed by the excess solder interfering with the operation of the MEMS devices is significantly reduced. This reduction in cost furthers the development of commercially-viable MEMS devices, by reducing the number of MEMS devices that malfunction. Other advantages may be readily ascertainable by those skilled in the art.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE DRAWINGS

Figure 1:
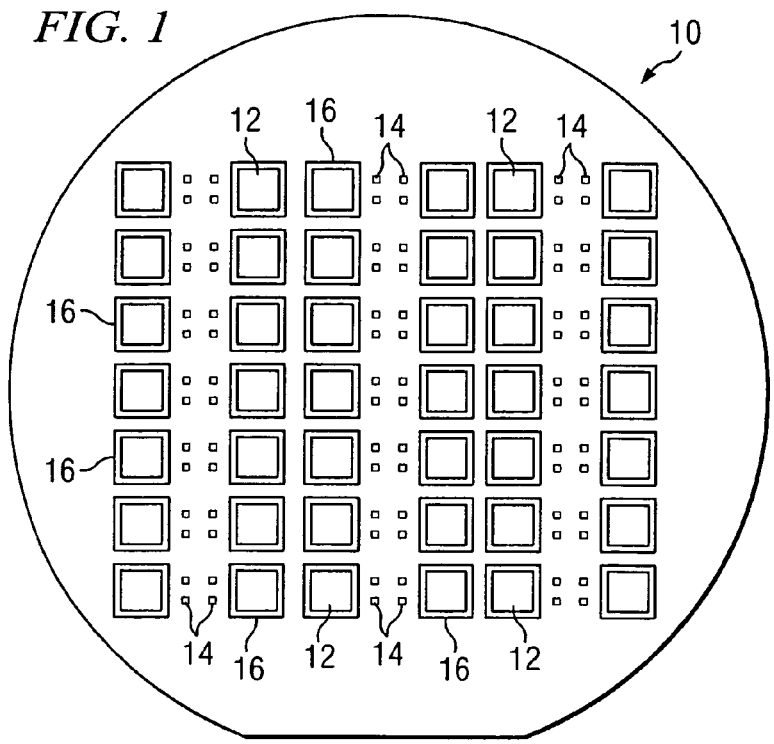
FIG. 1 is a top view of a device wafer in accordance with an embodiment of the present invention.

Infrared microelectromechanical systems (MEMS) devices, certain other inertial MEMS devices, and other similar devices require a vacuum environment to attain maximum performance. For example, infrared micro-bolometers require an operating pressure of less than 10 militorr to minimize thermal transfer from the detector elements to the substrate and package walls. Thus, vacuum-compatible materials processes and equipment must be used. Infrared devices also require an optically-transparent cover. These packaging requirements result in high labor and capital expense and present a significant cost in producing commercially-viable MEMS devices. Under current techniques, MEMS devices packaging costs can be 10 to 100 times the basic device fabrication cost, even in reasonably high volume. Additionally, MEMS devices are fragile. According to various embodiments of the present invention, special handling techniques have been developed to protect the MEMS devices during the vacuum packaging of infrared detectors, integrated circuits, or MEMS devices. Generally, a plurality of MEMS or similar devices are packaged in individual vacuum- or hermetically-sealed packages simultaneously. The devices are created on a device wafer, which may have a silicon or other suitable substrate. The substrate may have sealing surfaces bondable to a lid wafer, which may be manufactured to have cavities or similar enclosures corresponding to each device on the device wafer. The lid wafer and device wafer are then bonded with each other, using solder, an adhesive or other suitable bonding material. After the lid wafer and device wafer are bonded, the result is a plurality of individually-packaged MEMS devices contained in one bonded wafer assembly. These individually-packaged devices may then be separated into individual devices by dicing, or sawing through the wafer assembly between the devices. During the manufacture of MEMS devices under previous methods, excess solder or adhesive from the sealing ring often overflowed into the device area, forming solder balls or spots that interfered with device operation. Additionally, solder leaked into the cavity area of the lid structure, thus obscuring the optical properties of the lid wafer and interfering with the circuits' operation, or destroying the circuit altogether.

One solution to high packaging costs is to eliminate traditional individual vacuum packaging of a completed die. This may be accomplished by moving the packaging step into the wafer fabrication area. A lid wafer is aligned and mounted to the device wafer, which has individual MEMS mounted thereon, using contiguous sealing layers disposed around each individual MEMS device on the device wafer. Unfortunately, MEMS devices manufactured according to this technique may result in an unacceptable number of MEMS devices being destroyed or having decreased performance. This destruction or decreased performance is due to the sealing material leaking onto the lid wafer enclosing each individual MEMS device. A solution to excess solder leaking into the area of the lid covering each individual MEMS device is to manufacture the lid wafer with a trench surrounding the area designed to cover the MEMS device. This trench may be formed on the lid wafer in such a way that the solder, adhesive, or other sealing material, which is forced out from between the sealing surfaces of the device wafer and the lid wafer during bonding, is retained therein. Thus excess solder, adhesive, or other bonding material is prohibited from entering the cavity area of the lid wafer.

Referring to FIG. 1, a silicon device wafer 10 is a standard substrate used for fabrication of integrated circuit devices, MEMS devices, or similar devices. However, any suitable substrate material may be used. For example, a substrate material with integrated circuit readout devices embedded therein may be used as the device wafer 10. Silicon device wafers may have many MEMS devices 12 formed thereon using traditional methods of integrated circuit fabrication. Although the embodiments disclosed herein discuss integrated circuit fabrication in terms of vacuum packaging for MEMS devices, the method may be used to provide vacuum packaging of any integrated circuit device, or similar device, formed on a substrate material and contained within a vacuum package. Additionally, the method for manufacturing the lid wafer disclosed herein may be used in any vacuum or non-vacuum packaging of integrated circuit devices.

Each MEMS device 12 preferably has one or more associated bonding pads 14, which provide electrical connections to the MEMS device 12. As indicated in FIG. 1, each MEMS device 12 has two associated bonding pads 14. These bonding pads 14 are preferably disposed only on one side of the MEMS device 12. In any particular embodiment, however, bonding pads 14 may be disposed on any side, one side, or multiple sides of MEMS device 12. In addition to device wafer 10, MEMS devices 12, and bonding pads 14, FIG. 1 also depicts sealing surface 16 which defines the vacuum package around a MEMS device 12. Although this description discusses one MEMS device enclosed in each vacuum package, it should be noted that multiple MEMS devices may be enclosed within a vacuum package defined by sealing surface 16.

Figure 2:
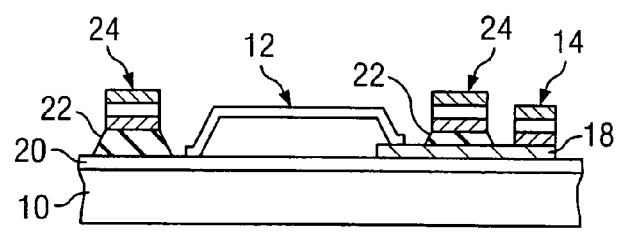
FIG. 2 is a partial cross-sectional view of a MEMS device in accordance with an embodiment of the present invention.

Referring now to FIG. 2, a single MEMS device 12 is illustrated to more completely show the layout on device wafer 10. A lead 18 connects each bonding pad 14 to MEMS device 12. A space is left between MEMS device 12 and bonding pad 14 to form the device sealing surface 16. Note that lead 18 runs beneath fabrication layers to be built within device sealing surface 16. Because the device sealing surface 16 defines the area of the device wafer 10 within which a vacuum package will be formed, leads 18 form electrical connections to bonding pads 14 without affecting the vacuums' seal existing around MEMS device 12.

Sealing surface 16 is formed on device wafer 10 such that a sealing layer 22 and bonding adhesion surface 24 may be formed thereon. Sealing layer 22 may be comprised of any suitable material having dielectric properties. Sealing layer 22 serves as a platform upon which bonding adhesion surface 24 may be deposited. Preferably, sealing layer 22 is composed of silicon nitride, although any suitable dielectric may be used. Sealing layer 22 provides electrical isolation for leads 18. A bonding adhesion surface 24 is fabricated on sealing layer 22 and may be fabricated using any combination of metal, metal alloy or other material that is suitable for bonding device wafer 10 and lid wafer 30 together. In one embodiment, bonding adhesion surface 24 may comprise a first layer of titanium, a second, middle layer of platinum, and a third layer of gold. However, there are many suitable materials or combinations of materials available for use in fabricating bonding adhesion surface 24. Bonding adhesion surface 24 may be deposited at the same time bonding pads 14 are deposited on device wafer 10. Although device sealing surface 16 has been described as utilizing a heat-activated solder, a compression seal, such as indium compression seal, may also be used.

Figure 3:
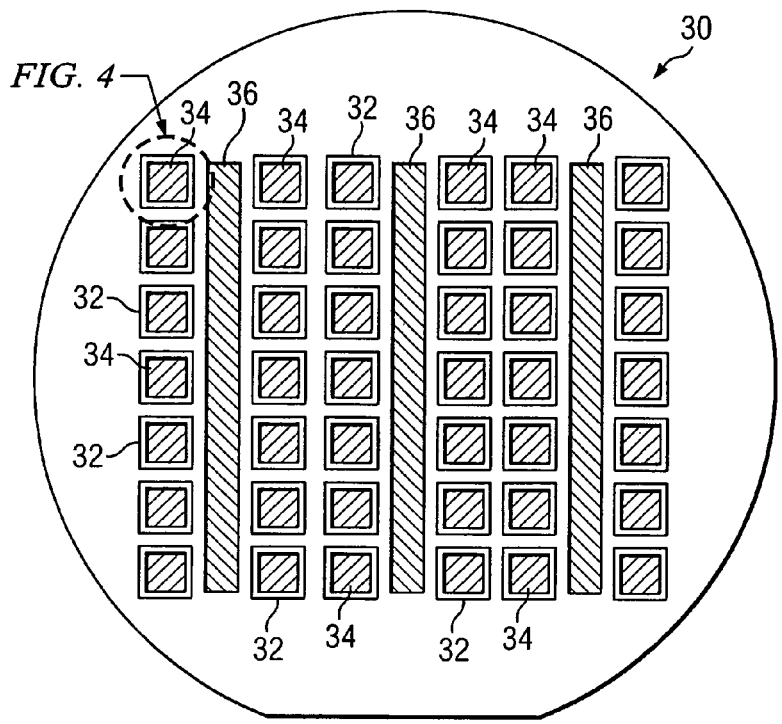
FIG. 3 is a top view of a patterned side of a lid wafer in accordance with an embodiment of the present invention.

FIG. 3 illustrates a silicon lid wafer 30. Although the embodiment described below utilizes a silicon wafer as a substrate for the lid wafer 30, any suitable substrate material may be used. Lid wafer 30 includes a plurality of lid sealing surfaces 32 corresponding in number to the device sealing surfaces 16 on device wafer 10. Each of the lid sealing surfaces 32 is preferably a mirror image of the corresponding device sealing surface 16 so that lid wafer 30 mates with device wafer 10. Cavities 34 and bonding pad channels 36 are etched in the lid wafer 30 using an appropriate process such as wet or dry etching. Additionally, anisotropic etching using potassium hydroxide or any suitable basic solution may be used to etch cavities 34 and bonding pad channels 36. The etching process for cavities 34 and bonding pad channels 36 may include depositing a layer of silicon nitride, and patterning the silicon nitride layer to form an appropriate etch mask. Cavities 34 and bonding pad channel 36 provide clearance over the MEMS devices formed on device wafer 10 and the bonding pads 14 connected by leads 18 to MEMS device 12, respectively. Additionally, bonding pad channels 36 provide clearance over bonding pads 14 so that a dicing saw, etching process, or other suitable process may be used in a later step to open the lid wafer to expose the bonding pads for device testing before dicing of the wafer.

Figure 4:
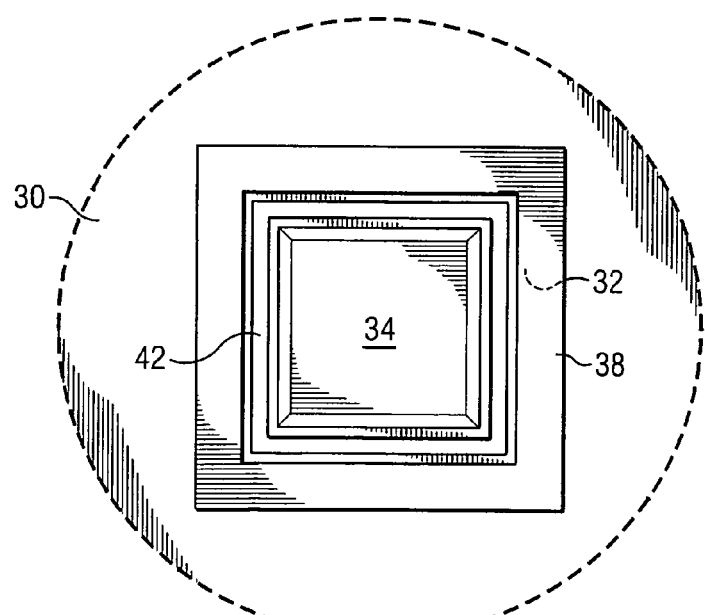
FIG. 4 is an enlarged view of a portion of a lid wafer in accordance with an embodiment of the present invention.

FIG. 4 illustrates an individual sealing surface 32 and cavity 34. A trench 42 is fabricated within sealing surface 32 between bonding adhesion surface 38 and cavity 34. Bonding adhesion surface 38 is deposited on sealing surface 32, and is comprised of any combination of metal or metal alloys that will provide a surface wetable by the solder, adhesive, or other bonding material, and secure attachment to device wafer 10. In one embodiment, bonding adhesion surface 38 is preferably comprised of a first layer of titanium, followed by a second, middle layer of platinum, and a third, outer layer of gold.

Figure 5:
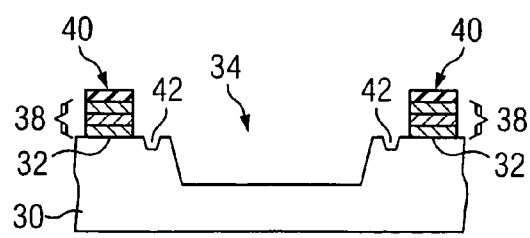
FIG. 5 is a partial cross-sectional view of the lid wafer of FIG. 3.

FIG. 5 illustrates a cross-sectional view of the lid wafer section illustrated by FIG. 4. In the present embodiment, trench 42 is preferably disposed on sealing surface 32 between bonding adhesion surface 38 and cavity 34. Preferably, trench 42 is fabricated on lid wafer 30 during fabrication of bonding adhesion surface 38 and cavity 34. Trench 42 may be created in the same manner as the cavity 34 and bonding adhesion surface 38 as well as bonding pad channels 36, by, for example, isotropic wet or dry etching, or anisotropic potassium hydroxide etching. In an embodiment using isotropic wet or dry etching to create trench 42, the trench may be formed with a depth determined by the width of the surface opening of the trench. Preferably, the depth of the trench is approximately equal to the width. In an embodiment using anisotropic etching into silicon surfaces, the depth is also determined by width of the surface opening. In anisotropic etching, the trench depth, D, may be determined by the equation $2D \cong W\mathrm{TAN}(54.74°)$ where W is the width of the surface opening of the trench. It should be understood that the width and depth of trench 42 may be of any suitable dimensions so long as trench 42 provides the function of uptaking excess bonding adhesion material and preventing material from entering cavity 34. Additionally, a bonding layer 40 of solder or adhesive is preferably deposited on bonding adhesion surface 38. Thus, if a sealing material other than heat activated solder is used, the solder layer 40 may be replaced by a material necessary to obtain a vacuum or hermetic seal. In an alternative embodiment, an indium compression seal may be used.

Bonding layer 40 may be deposited using traditional integrated circuit fabrication techniques or other suitable deposition processes. For example, lid wafer 30 may be electroplated resulting in solder layer 40 being deposited upon lid bonding adhesion surface 38. Another method of depositing bonding layer 40, where a solder is used, includes using electroless plating. Another method of depositing bonding layer 40 includes using vacuum deposition. Yet another method of depositing bonding layer 40, where solder is used, includes using a pre-formed, pre-punched solder layer which is aligned over lid bonding adhesion surface 38 and attached thereto. Yet another embodiment uses solder balls deposited on bonding adhesion surface 38 using a template, which, when heated, form a uniform solder layer. Solder balls are then released from the template and attached to the bonding adhesion surface 38. The template is removed, leaving a relatively uniform distribution of solder balls on bonding adhesion surface 38. When lid wafer 30 is heated to an appropriate temperature, the solder balls melt and thus bond the lid wafer 30 to the device wafer 10 when the two wafers are pressed together.

Other suitable materials may be used to bond device wafer 10 to lid wafer 30, such as an indium compression seal, indium metal solder, metal alloy solder, or solder balls. Although the preferred embodiment contemplates depositing solder layer 40 on bonding adhesion surface 38, bonding layer 40 may also be deposited on a bonding adhesion surface on device wafer 10 (not explicitly shown).

Figure 6:
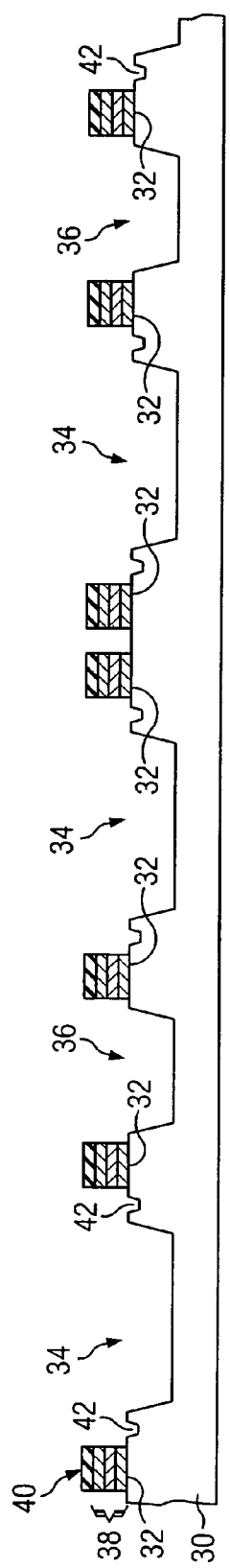
FIG. 6 is a partial cross-sectional view of the section of the lid wafer shown in FIG. 4.
Figure 7:
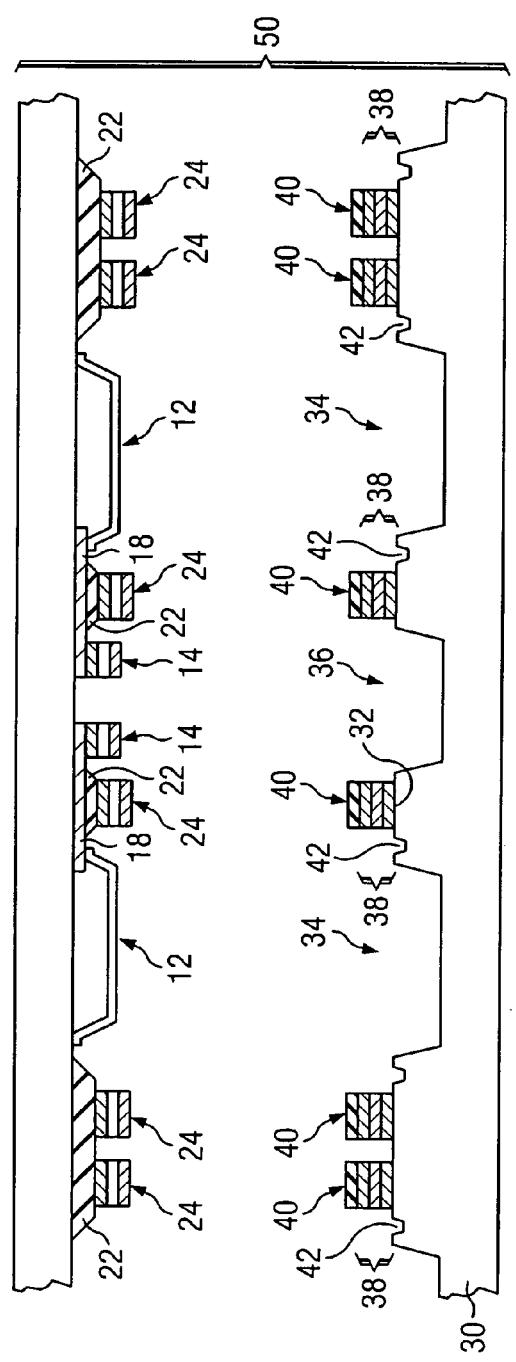
FIG. 7 is a partial cross-sectional view of a lid wafer and a device wafer illustrating the relationship of sealing layers on each wafer, in accordance with an embodiment of the present invention.

FIG. 6 illustrates a cross section of lid wafer 30, and the relationship of lid cavities 34, bonding pad channels 36, sealing surfaces 32, bonding adhesion surfaces 38, bonding layer 40, and trenches 42, all with respect to lid wafer 30. Lid wafer 30, as illustrated in FIG. 6, provides the basis for understanding the assembly illustrated by FIG. 7. FIG. 7 illustrates an assembly of a device wafer 10 and a lid wafer 30 ready for final assembly before placement in a vacuum furnace or other assembly chamber. Note that the lid wafer 30 is placed below the device wafer 10 so that the bonding layer 40 faces upward. Device wafer 10 is then aligned over lid wafer 30 such that the bonding adhesion surfaces 24 on device wafer 10 are aligned directly over the corresponding bonding adhesion surface 38 and bonding layer 40 on lid wafer 30. Upon heating of the bonding layer 40, device wafer 10 and lid wafer 30 are bonded together such that all MEMS devices 12 on device wafer 10 are enclosed in a package. If bonding layer 40 is not heat-activated, any other suitable chamber such as a vacuum chamber may be used in place of a heating chamber or vacuum furnace to provide the appropriate environment for bonding.

When device wafer 10 is brought into contact with lid wafer 30, some of the material of bonding layer 40, such as solder, adhesive, or other bonding material, may drip or ooze toward lid cavity 34. Trench 42 is disposed between bonding adhesion layer 38 on sealing layer 32 to prevent this material from entering lid cavity 34. During the use of solder balls to mate lid wafer 30 with device wafer 10, some of the solder balls may inadvertently become unattached from bonding adhesion surface 38 and roll toward lid cavity 34. In such a case, trench 42 is operable to retain these solder balls before they reach lid cavity 34 and are melted to lid wafer 30. Additionally, if some of the solder balls are not fully melted upon heat application to the assembly, the subsequent dicing of each individually packaged MEMS device could cause the solder balls to become detached and free-roaming within each individual package. If some of the solder balls enter the cavity, the solder balls could interfere with or even destroy MEMS device 12 by interfering with the electrical properties therein upon the application of electromagnetic energy. Thus, trench 42 is operable to prevent these solder balls from entering lid cavity 34.

Although the present invention has been described in detail, it should be understood that various changes, substitutions, and alterations may be made, without departing from the spirit and scope of the present invention as defined by the claims.

What is claimed is:

1. A method for manufacturing an integrated circuit device lid, comprising the steps of:

forming at least one lid cavity on a surface of a lid wafer, the lid wafer having a sealing surface;

forming at least one sealing structure on the lid wafer disposed around one of the at least one cavities, each sealing structure including a bonding adhesion structure coupled to the sealing surface of the lid wafer and a bonding layer coupled to the bonding adhesion structure such that the bonding layer is at least substantially separated from the sealing surface of the lid wafer by the bonding adhesion structure; and forming at least one at least substantially continuous trench in the sealing surface of the lid wafer and disposed around the cavity and between the cavity and the sealing structure, the trench being defined in part by a pair of side walls extending at least substantially continuously around the cavity.

2. The method of claim 1, wherein the at least one lid cavity is formed by wet or dry isotropic etching.

3. The method of claim 1, wherein the step of forming at least one lid cavity comprises forming a plurality of lid cavities on the surface of the lid wafer.

4. The method of claim 3, wherein the step of forming at least one sealing structure comprises forming a plurality of sealing structures on the surface of the lid wafer, each sealing structure disposed around one of the plurality of lid cavities.

5. The method of claim 4, wherein the step of forming at least one at least substantially continuous trench comprises forming a plurality of at least substantially continuous trenches, each at least substantially continuous trench disposed between one of the sealing surfaces and one of the lid cavities.

6. The method of claim 1, wherein the at least one at least substantially continuous trench is formed by isotropic wet or dry etching.

7. The method of claim 1, wherein the at least one at least substantially continuous trench is formed by anisotropic etching.

8. The method of claim 1, wherein the at least one at least substantially continuous trench is formed with a depth and width that are approximately equal.

9. The method of claim 1, wherein the depth of the at least one at least substantially continuous trench is determined by the width of a surface opening of the trench.

10. The method of claim 1, further comprising:
placing the lid wafer below a device wafer so that the bonding layer of the lid wafer faces upward, the device wafer comprising a bonding adhesion structure;
aligning the device wafer over the lid wafer such that the bonding adhesion surface of the device wafer is aligned with the bonding layer of the lid wafer; and
bonding together the device wafer and the lid wafer with the bonding layer of the lid wafer.

11. The method of claim 1, wherein the bonding layer is a solder layer.

12. The method of claim 1, wherein the bonding layer is an adhesive.

13. The method of claim 1, wherein the each of the at least one cavities formed in the lid wafer is operable to receive an integrated circuit device such that at least a portion of the integrated circuit device extends into the cavity.

14. The method of claim 1, wherein each of the at least one cavities formed in the lid wafer is operable to receive a microelectromechanical systems (MEMS) device such that at least a portion of the MEMS device extends into the cavity.

* * * * *